United States Patent
Blake et al.

(10) Patent No.: US 9,489,255 B2
(45) Date of Patent: Nov. 8, 2016

(54) DYNAMIC ARRAY MASKING

(71) Applicant: International Business Machines Corporation, Armonk, NY (US)

(72) Inventors: Michael A. Blake, Wappingers Falls, NY (US); Hieu T. Huynh, Austin, NY (US); Pak-kin Mak, Poughkeepsie, NY (US); Arthur J. O'Neill, Jr., Poughkeepsie, NY (US); Rebecca S. Wisniewski, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/620,698

(22) Filed: Feb. 12, 2015

(65) Prior Publication Data

US 2016/0239378 A1 Aug. 18, 2016

(51) Int. Cl.
*G06F 11/10* (2006.01)
*G06F 12/12* (2016.01)

(52) U.S. Cl.
CPC ......... *G06F 11/1064* (2013.01); *G06F 12/121* (2013.01); *G06F 2212/1021* (2013.01); *G06F 2212/69* (2013.01)

(58) Field of Classification Search
CPC ........... G06F 12/0879; G06F 12/0802; G06F 12/0835; G06F 12/0888; G06F 12/126; G06F 11/1064
USPC ........................................................ 714/763
See application file for complete search history.

(56) References Cited

U.S. PATENT DOCUMENTS

| | | | | | |
|---|---|---|---|---|---|
| 5,469,558 | A | * | 11/1995 | Lieberman | G06F 11/1016 710/105 |
| 5,958,068 | A | * | 9/1999 | Arimilli | G06F 12/0802 711/133 |
| 6,006,311 | A | * | 12/1999 | Arimilli | G06F 12/126 365/200 |
| 7,117,342 | B2 | | 10/2006 | Tremblay et al. | |

(Continued)

FOREIGN PATENT DOCUMENTS

WO 2008073654 A1 6/2008

OTHER PUBLICATIONS

Charles W. Slayman: "Cache and Memory Error Detection, Correction, and Reduction Techniques for Terrestrial Servers and Workstations", IEEE, 2005; pp. 8.

(Continued)

*Primary Examiner* — David Ton
(74) *Attorney, Agent, or Firm* — Cantor Colburn LLP; Margaret McNamara (57) ABSTRACT

A method, system, and/or computer program product for dynamic array masking is provided. Dynamic array masking includes, during execution of computer instructions that access a cache memory, detecting an error condition in a portion of the cache memory. The portion of the cache memory contains an array macro. Dynamic array masking, during the execution of the computer instructions that access a cache memory, further includes dynamically setting mask bits to indicate the error condition in the portion of the cache memory and preventing subsequent writes to the portion of the cache memory in accordance with the dynamically set mask bits. Embodiments also include evicting cache entries from the portion of the cache memory. This evicting can include performing a cache purge operation for the cache entries corresponding to the dynamically set mask bits.

18 Claims, 7 Drawing Sheets

Process Flow 400

(56) References Cited

U.S. PATENT DOCUMENTS

| | | |
|---|---|---|
| 8,381,019 B2 | 2/2013 | Blake et al. |
| 8,447,932 B2 | 5/2013 | Berger et al. |
| 8,640,005 B2 | 1/2014 | Wilkerson et al. |
| 2011/0320732 A1* | 12/2011 | Ambroladze ......... G06F 12/126 711/135 |
| 2012/0030509 A1 | 2/2012 | Wood et al. |
| 2012/0054549 A1 | 3/2012 | Kwan et al. |
| 2014/0281261 A1 | 9/2014 | Vera et al. |

OTHER PUBLICATIONS

Chris Wilkerson et al.,: "Reducing Cache Power With Low-Cost, Multi-Bit Error-Correcting Codes", ACM, 2010; pp. 11.

Se-Hyun Yang, et al. "Exploiting Choice in Resizable Cache Design to Optimize Deep-Submicron Processor Energy-Delay"; 8th International Symposium on High-Performance Computer Architechture; 2002; pp. 11.

Shuai Wang, et al.; "On the Characterization and Optimization of On-Chip Cache Reliability Against Scof Errors" IEEE Transactions on Computers, vol. 58, No. 9, Sep. 2009; pp. 14.

* cited by examiner

Process Flow 600

DYNAMIC ARRAY MASKING

BACKGROUND

The present disclosure relates generally to cache memory, and in particular, to dynamic array masking of the cache memory.

Conventionally, array masking may be employed to circumvent defects or cache errors within a cache memory of a computer system. Array masking, in general, is an identification of the defects or the cache errors (e.g., correctable and uncorrectable errors) as part of a diagnostic test of the computer system to bring the computer system online, followed by a marking of portions of the cache memory that are unusable due to uncorrectable errors. If a correctable error is identified, then a corresponding cache error is fixed prior to running the computer system. If an uncorrectable error is identified, then a masking bit is enabled for a portion of the cache memory associated with the uncorrectable error so that when the computer system is running, that corresponding portion is skipped. However, not only does conventional array masking due to this diagnostic, mark, and run approach fail to keep pace with addressing real-time cache errors, experience has also shown that cache array errors lead to multiple field unscheduled incident repair actions.

SUMMARY

Embodiments include a method, system, and/or computer program product for dynamic array masking. Dynamic array masking includes, during execution of computer instructions that access a cache memory, detecting an error condition in a portion of the cache memory. The portion of the cache memory contains an array macro. Dynamic array masking, during the execution of the computer instructions that access a cache memory, further includes dynamically setting mask bits to indicate the error condition in the portion of the cache memory and preventing subsequent writes to the portion of the cache memory in accordance with the dynamically set mask bits. Embodiments also include evicting cache entries from the portion of the cache memory. This evicting can include performing a cache purge operation for the cache entries corresponding to the dynamically set mask bits.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments described herein relate to a mechanism for addressing cache array errors in real-time rather than through a diagnostic test executed prior to running the computer system. The mechanism can be a dynamic array masking of a cache memory that eliminates a risk of certain cache errors. Dynamic array masking directly addresses isolated correctable errors (CEs) and/or uncorrectable errors (UEs) in real-time before they worsen (e.g., cause floods of CEs and UEs).

CEs can be detected hardware errors that can be recovered from without any software impact. UEs are detected hardware errors that cannot be recovered from and may result in a software impact. A worst case UE may result in unscheduled incident repair actions (UIRAs). An example of a UIRA is a computer system 'crash' that requires an immediate repair action, such as replacing hardware or re-powering the computer system.

Some array failures can be located on an array macro bitline and develop as a random stream of CEs on many different cache memory slots, while other array failures can be located on one or more cache array macro wordlines and appear as a stream of CEs or UEs on one or more congruence classes (also known as address indexes). In all cases, array failures can be isolated to a particular sub-array macro of an array macro. Further, the array failures can initially start out as isolated CEs and/or UEs that gradually increase to floods of CEs and UEs.

Thus, by addressing/identifying each defect and/or cache error as a CE or a UE during run-time, in addition to through the diagnostic test executed prior to running the computer system as described above, embodiments described herein can directly address isolated correctable errors (CEs) and/or uncorrectable errors (UEs) in real-time before they worsen.

Figure 1:
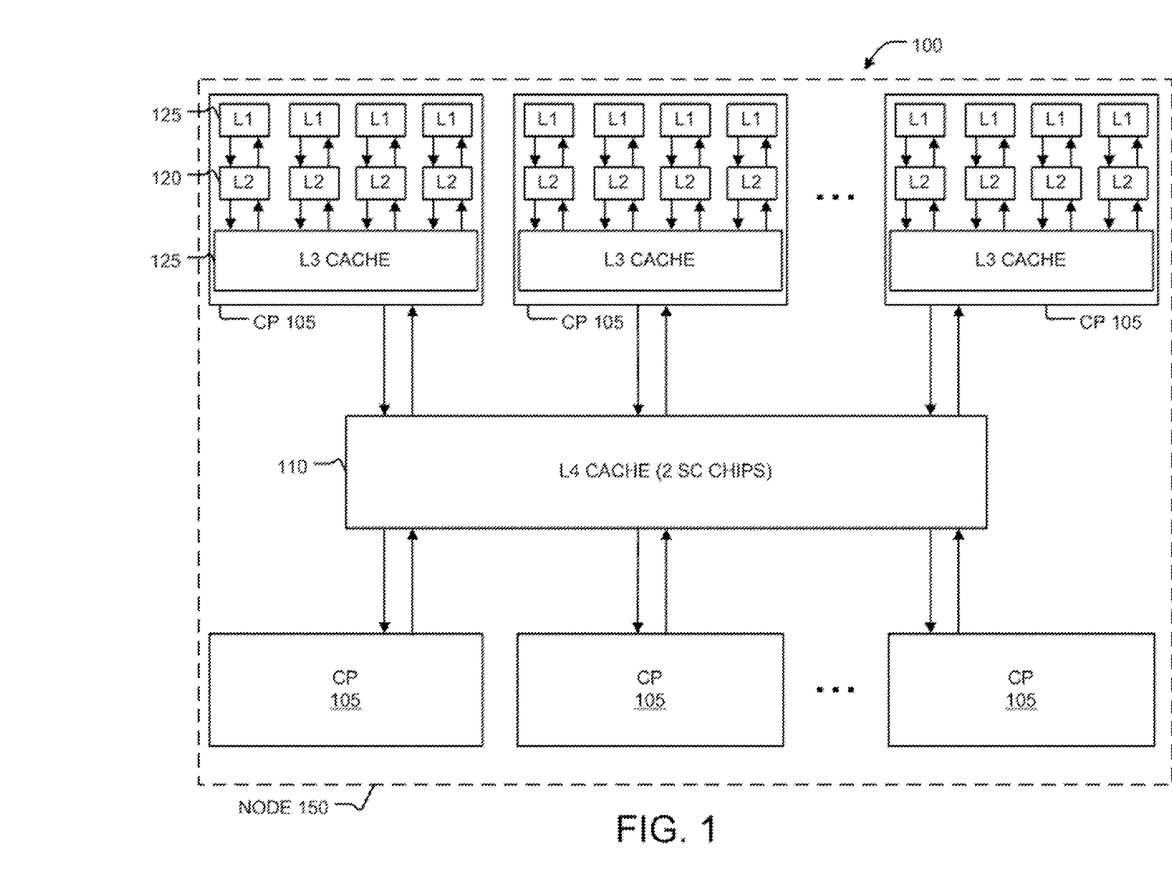
FIG. 1 depicts a cache topology.

FIG. 1 illustrates a cache topology 100 that includes a plurality of central processors (CP) 105 (e.g., central processing units as described below) operatively connected via busses to one or more L4 caches 110. In general, L4 cache 110 can be organized in a variety of ways, such as where the portion of each L4 cache 110 located on each semi-conductor (SC) chip is 96 MB organized into 16 banks and 24 sets, and as further described below with respect to FIGS. 2 and 3. Further, a vector of array masks can mask a small section of the L4 cache 110 (e.g., if there are 48 masks in total per chip, three masks per bank, and one mask on 8 sets, each active mask blocks any of its 8 sets from being picked on a cache miss LRU selection). Note that, while masking was intended to mitigate impacts on embedded dynamic random access memory (EDRAM), array masking does not affect lines that already exist in the L4 caches 110.

Although not shown in FIG. 1, each of the central processors 105 includes one or more cores that may perform reading and executing of computer instructions. On each central processor 105, the multiple cores may be operatively connected via busses to the L1, L2, and L3 caches 125, 120, and 115. The L1 caches 125 are physically closest to the cores, with the L2 caches 120 and the L3 caches 115 successively further from the cores. Note that the designation of caches may be reversed. Further, note that the L3 and L4 caches 115 and 110 may comprise EDRAM, and/or any other type of suitable memory, such as dynamic random access memory (DRAM). The plurality of central processors 105 operatively connected to the L4 caches 110 (e.g., two L4 caches) form a node 150. In a computing system, a plurality of nodes 150 may be operatively connected to one another for communications such as making and responding to requests, or any suitable operation.

Each individual central processor 105 may be fabricated on a separate chip, which may include the L1, L2, and L3 caches 125, 120, and 115. The L4 cache 110 may be fabricated on a separate chip, or a combination of separate chips. According to example embodiments of the present invention, the L4 cache 110 is formed on two (2) separate chips. Fabrication of the chips (including integrated circuits, wires, metal layers, semiconductor and/or other material components) may be facilitated through lithography and/or other suitable techniques. The fabrication process may include various deposition techniques including physical vapor deposition (PVD), chemical vapor deposition (CVD), electrochemical deposition (ECD), molecular beam epitaxy (MBE), atomic layer deposition (ALD) and/or any suitable technique.

Figure 2:
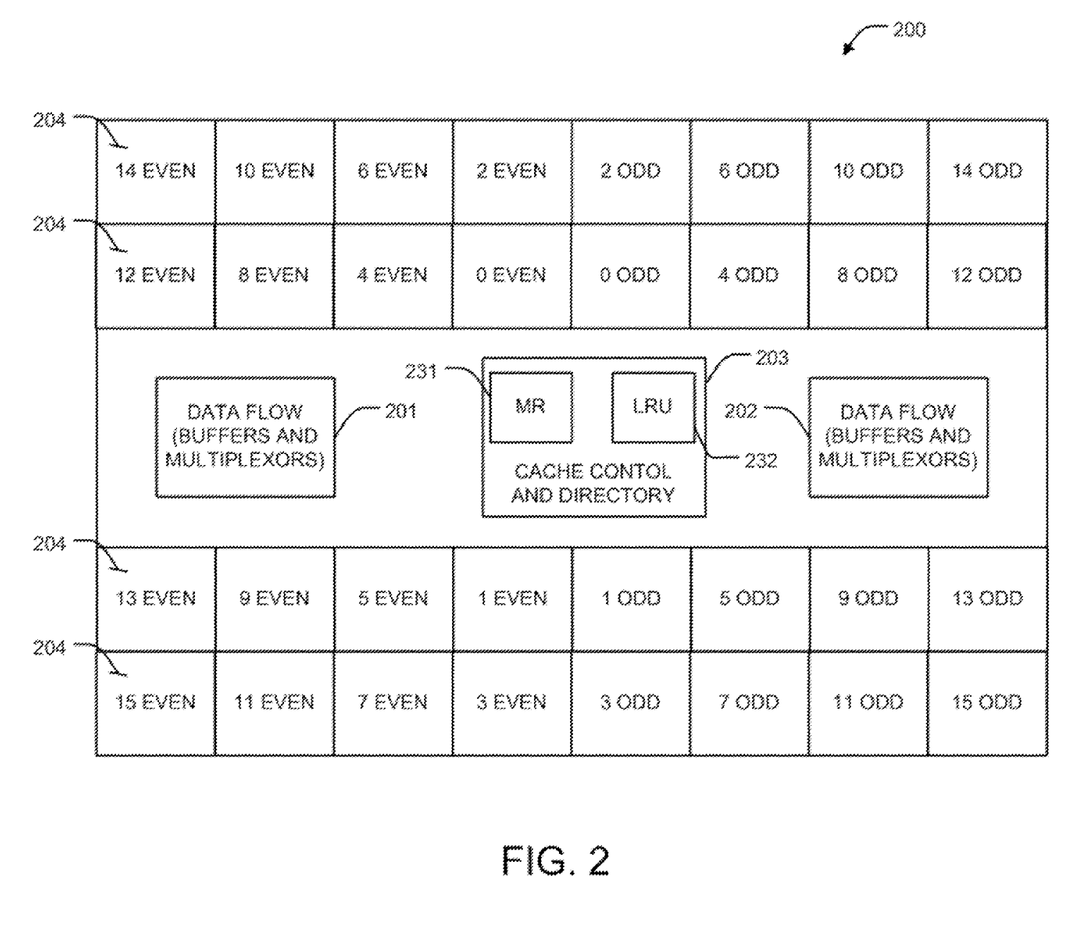
FIG. 2 depicts a logical layout of a single cache chip.

Turning to FIG. 2, an example of a logical layout of a single cache chip is illustrated. For example, the cache may be a L4 cache. It should be understood that according to at least one exemplary embodiment, an entire cache is divided amongst two chips, and therefore, a complete cache would include two chips 200. A complete example cache may be twenty-four (24) way set associative, comprised of one thousand five hundred thirty-six (1536) EDRAM macros on the two chips. Thus, each chip may include seven hundred sixty-eight (786) EDRAM macros. The complete example cache may be address sliced into thirty-two (32) banks, further separated into three groups of eight-way associative macros thereby achieving twenty-four (24) way set associativity. Each chip may include half of the complete example cache banks, or sixteen (16) banks Each bank may include forty-eight (48) EDRAM macros divided into three groups of sixteen (16). Therefore, for one chip of a complete example cache, there are twenty-four (24) associativity classes and sixteen thousand (16,000) congruence classes, with each cache bank including one thousand (1,000) of the congruence classes and twenty-four (24) associativity classes.

A single chip 200 may include sixteen (16) cache banks, divided into EVEN and ODD sections, labeled 0-15 EVEN/ODD. Therefore each chip 200 may include half of the total thirty-two (32) cache banks of a complete example cache. The single chip 200 may also include data flow portions 201 and 202. The data flow portions 201 and 202 may include buffers and multiplexors (not illustrated for the sake of clarity) to facilitate data flow across the chip 200. The chip 200 may further include a cache control and directory 203. The cache control and directory 203 provides control of cache reads/writes. The cache control and directory 203 includes a cache array mask register 231 and least recently used (LRU) selection logic 232.

The cache array mask register 231 may provide a logical mask to the LRU selection logic 232, the logical mask configured to identify a particular set of EDRAMS to disable.

The LRU selection logic 232 is configured to select an associativity class in which a new cache line is to be installed/written. Through comparison of the logical mask and a bank address, the LRU selection logic 232 may disable write operations to the particular set of EDRAM macros identified in the logical mask. Detailed description of EDRAM macro disablement is provided below with reference to FIG. 3.

Figure 3:
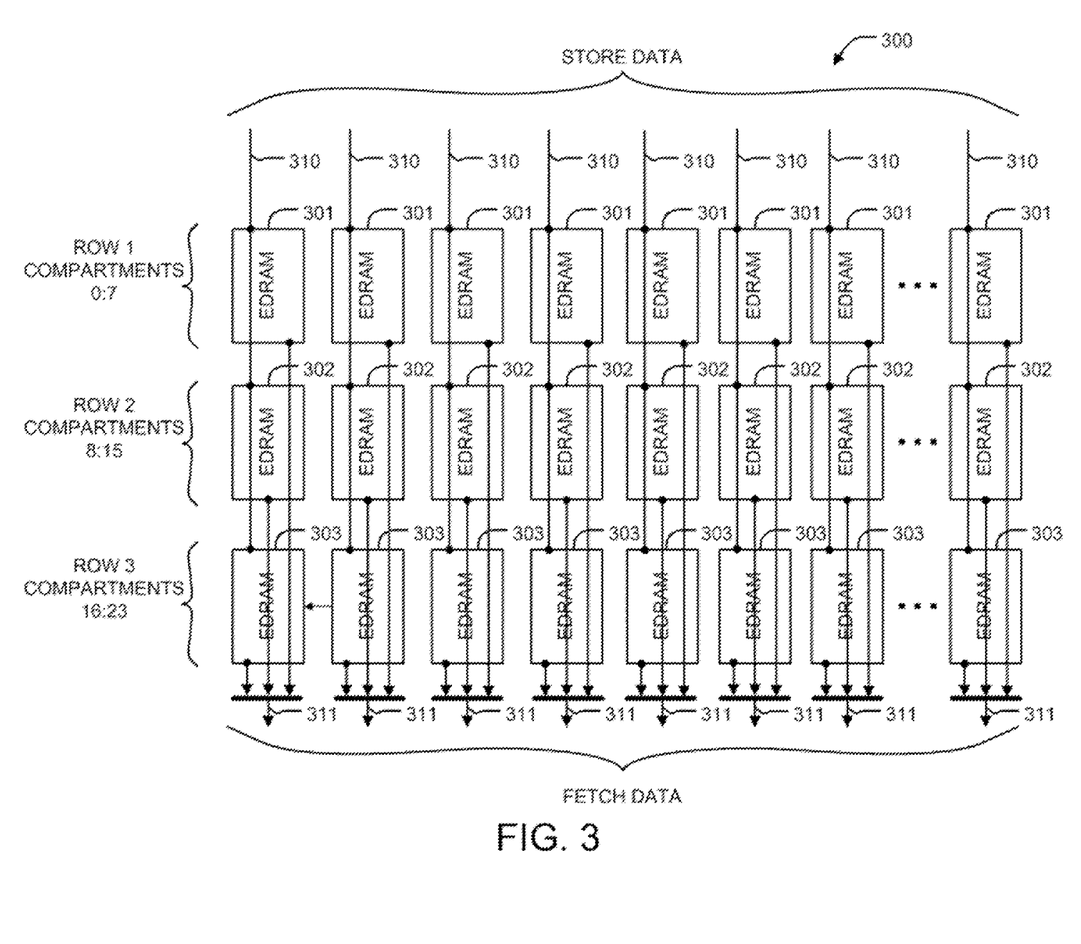
FIG. 3 depicts a logical view of a single cache bank.

FIG. 3 depicts an example of a logical view of a single L4 cache bank. The cache bank 300 includes a plurality of EDRAM macros 301-303. As described above, according to some example embodiments, a cache bank may include forty-eight EDRAM macros. The plurality of EDRAM macros 301-303 are divided into twenty-four (24) compartments arranged in three rows, labeled ROW 1, ROW 2, and ROW 3. ROW 1 includes the plurality of EDRAM macros 301, and provides eight compartments (0 through 7). ROW 2 includes the plurality of EDRAM macros 302, and provides eight compartments (8 through 15). ROW 3 includes the plurality of EDRAM macros 303, and provides eight compartments (16 through 23). Each EDRAM macro, and consequently each ROW contains 1024 lines, addressable via 10 line address bits (not shown for clarity).

The cache bank 300 receives store data over a plurality of communication buses 310. The store data is stored in associated EDRAMS depending upon an associated compartment and line addresses. The cache bank 300 transfers fetched data over a plurality of communication buses 311. Each communication bus of the plurality of communication buses 310-311 may be a 16 byte wide communication bus comprised of individual 9-bit wide communication buses. Therefore, the cache bank 400 provides 1 k of the 16 k congruence classes of a single cache memory chip (e.g., 200).

In consideration of the cache topology 100 as described above, disablement of a portion of the cache memory may be as follows. For example, as each cache bank includes three rows of eight-way set associative macros, one or two of the rows may be disabled entirely while still maintaining operability of the entire cache. If one row is disabled, defective EDRAM macro(s) of the row may be avoided while releasing only about one percent (e.g., 1/(32*3)) of an entire example cache's capacity. In turn, the cache bank 300 may have any of one of ROW 1, ROW 2, or ROW 3 disabled using a logical mask. The logical mask may be provided to LRU selection logic 232 of a cache memory chip including the cache bank 300. If a row (e.g., compartment set) is disabled, another row is used for line installs. In this way, as a complete example cache may be twenty-four way set associative, and each row may include eight associativity classes, if any one row is disabled, sixteen associativity class remain for line installs. Furthermore, two of the three rows may be disabled, leaving only one row for line installs. However, it follows that if all three rows are disabled, there would be no associativity classes remaining, resulting in an unusable cache memory chip.

Figure 4:
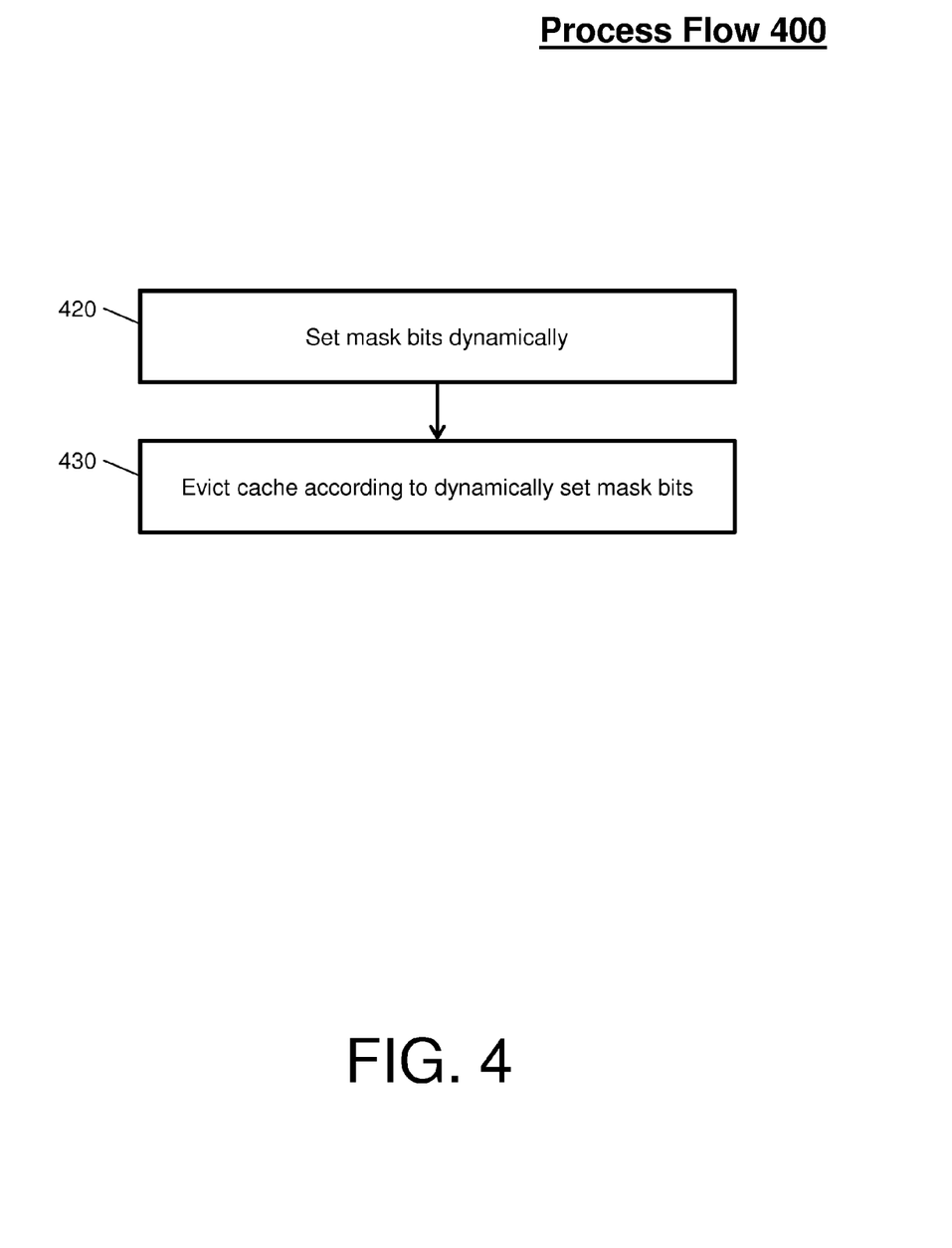
FIG. 4 depicts a process flow for dynamic array masking in accordance with an embodiment.

FIG. 4 will now be described in view of the above. FIG. 4 illustrates a process flow 400 for dynamic array masking that proactively stops a use of a portion of cache that is experiencing array macro errors before those array macro errors result in UIRAs. An array is a systematic arrangement of objects, items, variables, etc. A macro is an instruction, rule, or pattern that specifies how an input sequence should be mapped into an output sequence to perform a particular task. An array macro can be an instruction set pertaining to a set of objects, items, variables, etc. that expand into.

The process flow 400 begins at block 420 where mask bits are dynamically set. For instance, a computer system can detect whether a special class of cache errors exists and mask a section of cache that contains the array macro experiencing these errors to prevent any new data from being installed in this macro. These special classes can include bitline and wordline fails. A bitline fail can affect one data bit of many storage addresses that map into specific bank. A wordline fail can affect multiple bits of a data shot as well as multiple data shots of multiple cache lines. In embodiments, the processing performed at block 420 is performed during system run-time, that is, during execution, by a processor, of computer instructions that access the cache. In an embodiment the computer instructions are executed by the processor as part of an application program such as, but not limited to: a business application program, a social media application program, and a software management application program.

Referring back to FIG. 4, at block 430, the process flow 400 evicts the cache according to the dynamically set bits. In this way, the computer system performs a special cache purge operation that only removes existing data from a portion of the cache that includes the masked section. In embodiments, the processing at block 430 can also be performed during system run-time.

Figure 5:
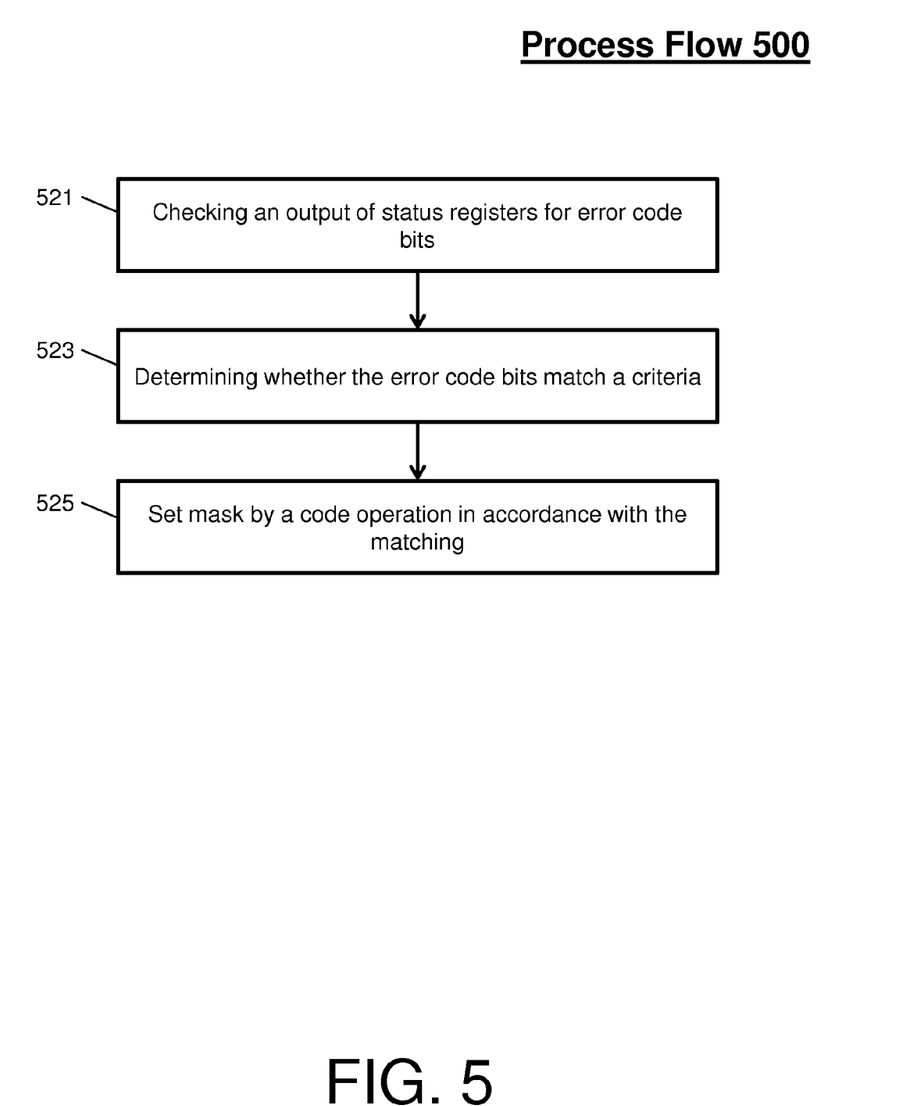
FIG. 5 depicts another process flow for dynamic array masking in accordance with an embodiment.

Turning now to FIG. 5, a process flow 500 (e.g., a subset of block 420 of process flow 400) is generally shown in accordance with an embodiment. The process flow 500 further describes how to set the mask bits dynamically, as opposed to setting them ahead of time. In this way, the process flow 500 detects pre-determined L4 cache error conditions and sets appropriate array mask of failing array macro. The process flow 500 begins at block 521 where an output of status registers for error code bits are checked. The process flow 500 may rely on the 5-second polling interval to collect L4 cache error information.

Next, at block 532, the process flow 500 determines whether the error code bits match criteria (e.g., pre-defined criteria). These criteria may be based on combination of single polling sample or history of polling samples. Using the pre-defined criteria, the process flow 500 can identify a single CE per cache access as a bitline fail, along with a bitline fail CE on multiple cache accesses on different congruence class addresses on failing bank. With respect to wordline fails, the process flow 500 can identify within a cache access multiple DW/QW shots of data with CEs and UEs. For example, to recognize a wordline fail using the pre-defined criteria, the process flow 500 can identify multiple errors on a single cache access on failing bank and multiple errors on multiple cache accesses on same congruence class on failing bank.

Next, at block 535, the process flow 500 sets a mask by a code operation in accordance with the matching. For instance, if the error code bits match the pre-defined criteria, the process flow 500 sets a corresponding mask bit. Note that masking prevents new data from getting installed in corresponding portion of the cache and does not clear out what is there already in a corresponding portion of the cache.

Figure 6:
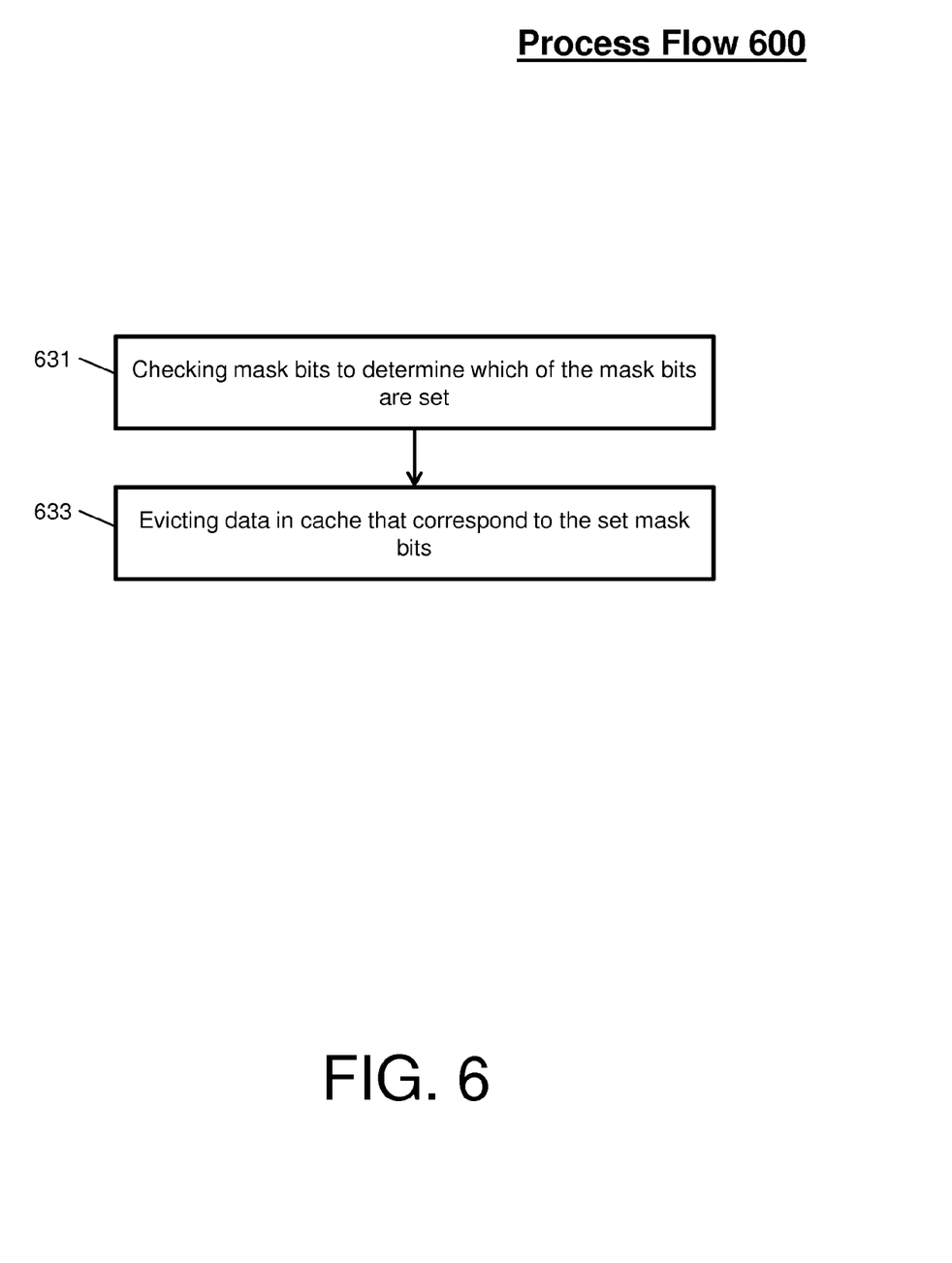
FIG. 6 depicts another process flow for dynamic array masking in accordance with an embodiment.

Turning now to FIG. 6, a process flow 600 (e.g., a subset of block 430 of process flow 400) is generally shown in accordance with an embodiment where once the process flow 500 sets the mask, an immediate purge of the corresponding portion of the cache can be forced. In this way, at block 631, the process flow 600 checks the mask bits to determine which of the mask bits are set. Then, at block 633, the process flow 600 evicts data in cache (cache entries) that correspond to the set mask bits. Thus, after masking, special cache purge operations may be enabled to clear out section of cache that includes masked macros. Note that line purge/delete operations and an array mask feature may not be tied together.

Figure 7:
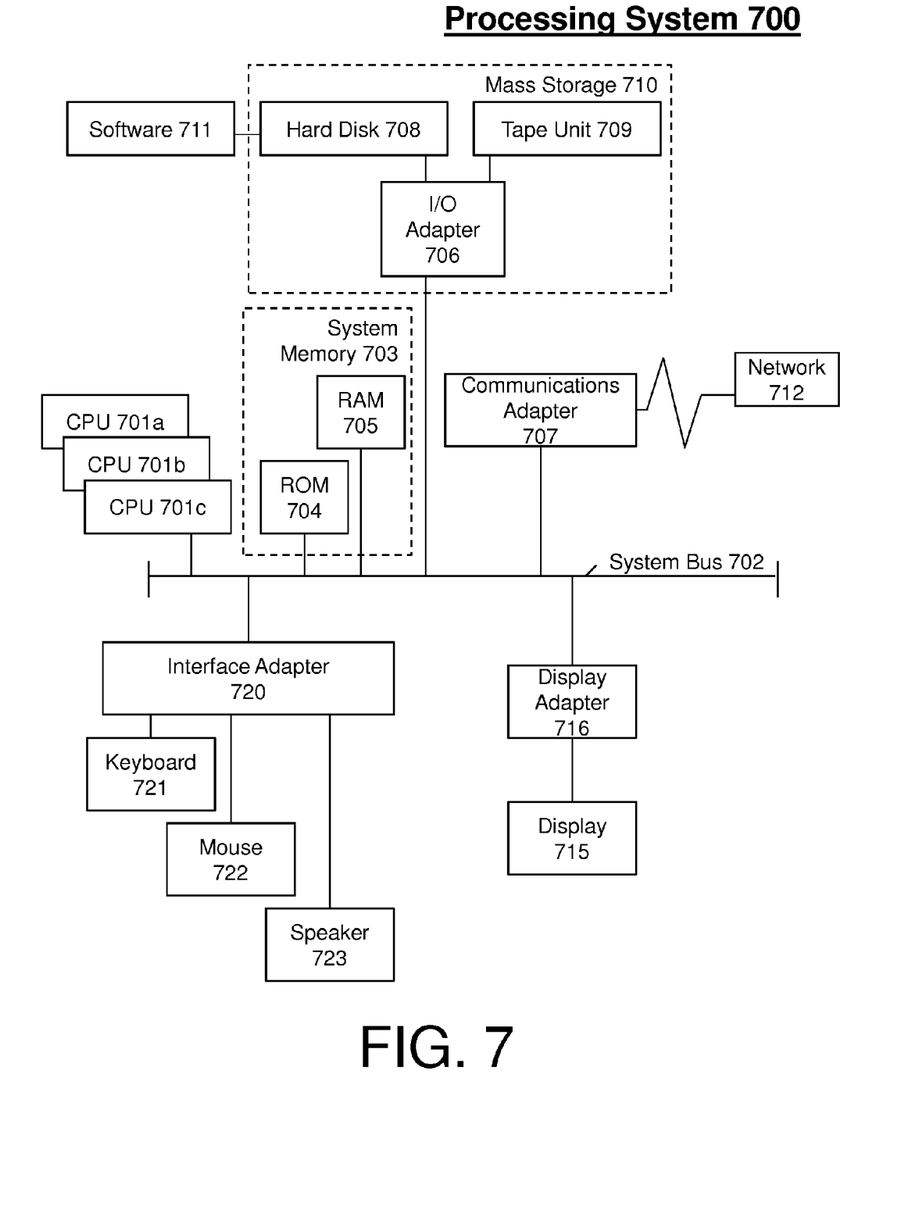
FIG. 7 depicts a processing system in accordance with an embodiment.

Referring now to FIG. 7, there is shown an embodiment of a processing system 700 for implementing the teachings herein. In this embodiment, the processing system 700 has one or more central processing units (processors) 701*a*, 701*b*, 701*c*, etc. (collectively or generically referred to as processor(s) 701). The processors 701, also referred to as processing circuits, are coupled via a system bus 702 to system memory 703 and various other components. The system memory 703 can include read only memory (ROM) 704 and random access memory (RAM) 705. The ROM 704 is coupled to system bus 702 and may include a basic input/output system (BIOS), which controls certain basic functions of the processing system 700. RAM is read-write memory, such as cache memory described above, coupled to system bus 702 for use by processors 701.

FIG. 700 further depicts an input/output (I/O) adapter 706 and a network adapter 707 coupled to the system bus 702. I/O adapter 706 may be a small computer system interface (SCSI) adapter that communicates with a hard disk 708 and/or tape storage drive 709 or any other similar component. I/O adapter 706, hard disk 708, and tape storage drive 709 are collectively referred to herein as mass storage 710. Software 711 for execution on processing system 700 may be stored in mass storage 710. The mass storage 710 is an example of a tangible storage medium readable by the processors 701, where the software 711 is stored as instructions for execution by the processors 701 to perform a method, such as the process flows of FIGS. 4-6. Network adapter 707 interconnects system bus 702 with an outside network 712 enabling processing system 700 to communicate with other such systems. A screen (e.g., a display monitor) 715 is connected to system bus 702 by display adapter 716, which may include a graphics controller to improve the performance of graphics intensive applications and a video controller. In one embodiment, adapters 706, 707, and 716 may be connected to one or more I/O buses that are connected to system bus 702 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 702 via an interface adapter 720 and the display adapter 716. A keyboard 721, mouse 722, and speaker 723 can be interconnected to system bus 702 via interface adapter 720, which may include, for example, a Super I/O chip integrating multiple device adapters into a single integrated circuit.

Thus, as configured in FIG. 7, processing system 705 includes processing capability in the form of processors 701, and, storage capability including system memory 703 and mass storage 710, input means such as keyboard 721 and mouse 722, and output capability including speaker 723 and display 715. In one embodiment, a portion of system memory 703 and mass storage 710 collectively store an operating system, such as the z/OS or AIX operating system from IBM Corporation, to coordinate the functions of the various components shown in FIG. 7.

Technical effects and benefits of embodiments of dynamic array masking can include eliminating the risk of certain cache errors (i.e., wordline or bitline fails) from causing future UIRAs by enabling a future hardware replacement or a computer system to run with reduced cache indefinitely. Further, the technical effects and benefits of dynamic array masking can include leveraging the unique ability in hardware to mask off a small stripe of L4 cache from computer system use.

The present invention may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device.

The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of dynamic array masking, comprising:
    during execution, by a processor, of computer instructions that access a cache memory:
        detecting an error condition in a portion of the cache memory, the portion of the cache memory containing an array macro,
        dynamically setting mask bits to indicate the error condition in the portion of the cache memory, and preventing subsequent writes to the portion of the cache memory in accordance with the dynamically set mask bits; and
    evicting cache entries from the portion of the cache memory, the evicting including performing a cache purge operation for the cache entries corresponding to the dynamically set mask bits.

2. The method of claim 1, wherein the dynamically setting of the mask bits prevents any new data from being installed into the array macro.

3. The method of claim 1, wherein the dynamically setting of the mask bits comprises:
    checking outputs of status registers of the cache memory for error code bits;
    determining whether the error code bits match a pre-defined criteria; and
    setting the mask bits corresponding to the status registers in response to the error code bits matching the pre-defined criteria.

4. The method of claim 3, wherein the pre-defined criteria include a combination of a single polling sample and history of polling samples.

5. The method of claim 3, wherein the pre-defined criteria identifies correctable errors and uncorrectable errors with respect to bitline and wordline fails.

6. The method of claim 1, wherein the evicting of the cache memory from the portion of the cache memory comprises:
    checking the mask bits to determine which of the mask bits are set; and
    immediately performing the cache purge operation of the portion of the cache memory in response to the determination of which of the mask bits are set.

7. A computer program product for dynamic array masking, the computer program product comprising a non-transitory computer readable storage medium having program instructions embodied therewith, the program instructions executable by a processor to cause the processor to perform:
    during execution, by the processor, of computer instructions that access a cache memory:
        detecting an error condition in a portion of the cache memory, the portion of the cache memory containing an array macro,
        dynamically setting mask bits to indicate the error condition in the portion of the cache memory, and preventing subsequent writes to the portion of the cache memory in accordance with the dynamically set mask bits; and
    evicting cache entries from the portion of the cache memory, the evicting including performing a cache purge operation for the cache entries corresponding to the dynamically set mask bits.

8. The computer program product of claim 7, wherein the dynamically setting of the mask bits prevents any new data from being installed into the array macro.

9. The computer program product of claim 7, wherein the dynamically setting of the mask bits comprises:
    checking outputs of status registers of the cache memory for error code bits;
    determining whether the error code bits match a pre-defined criteria; and
    setting the mask bits corresponding to the status registers in response to the error code bits matching the pre-defined criteria.

10. The computer program product of claim 9, wherein the pre-defined criteria include a combination of a single polling sample and history of polling samples.

11. The computer program product of claim 9, wherein the pre-defined criteria identifies correctable errors and uncorrectable errors with respect to bitline and wordline fails.

12. The computer program product of claim 7, wherein the instructions executable by the processor with respect to the evicting of the cache memory from the portion of the cache memory cause the processor to perform:
    checking the mask bits to determine which of the mask bits are set; and
    immediately performing the cache purge operation of the portion of the cache memory in response to the determination of which of the mask bits are set.

13. A system for dynamic array masking, the system comprising:
    a memory having computer readable instructions; and
    a processor for executing the computer readable instructions, the computer readable instructions causing the processor to perform:
    during execution, by the processor, of computer instructions that access a cache memory:
        detecting an error condition in a portion of the cache memory, the portion of the cache memory containing an array macro,
        dynamically setting mask bits to indicate the error condition in the portion of the cache memory, and preventing subsequent writes to the portion of the cache memory in accordance with the dynamically set mask bits; and
    evicting cache entries from the portion of the cache memory, the evicting including performing a cache purge operation for the cache entries corresponding to the dynamically set mask bits.

14. The system of claim 13, wherein the dynamically setting of the mask bits prevents any new data from being installed into the array macro.

15. The system of claim 13, wherein the computer readable instructions with respect to the dynamically setting of the mask bits further include:
    checking outputs of status registers of the cache memory for error code bits;

determining whether the error code bits match a pre-defined criteria; and setting the mask bits corresponding to the status registers in response to the error code bits matching the pre-defined criteria.

16. The system of claim 15, wherein the pre-defined criteria are a combination of a single polling sample or history of polling samples.

17. The system of claim 15, wherein the pre-defined criteria identifies correctable errors and uncorrectable errors with respect to bitline and wordline fails.

18. The system of claim 13, wherein the computer readable instructions with respect to the evicting of the cache memory from the portion of the cache memory further include:

checking the mask bits to determine which of the mask bits are set; and immediately performing the cache purge operation of the portion of the cache memory in response to the determination of which of the mask bits are set.

* * * * *